(12) United States Patent
Challa et al.

(10) Patent No.: US 8,780,768 B2
(45) Date of Patent: Jul. 15, 2014

(54) AUTOMATIC GAIN CONTROL ACQUISITION IN TIME DIVISION DUPLEX SYSTEMS

(75) Inventors: Raghu N. Challa, San Diego, CA (US); Brian Clarke Banister, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 284 days.

(21) Appl. No.: 13/069,296

(22) Filed: Mar. 22, 2011

(65) Prior Publication Data

US 2011/0243038 A1 Oct. 6, 2011

Related U.S. Application Data

(60) Provisional application No. 61/320,525, filed on Apr. 2, 2010.

(51) Int. Cl.
*H04J 3/06* (2006.01)

(52) U.S. Cl.
USPC .......................................... 370/280; 370/294

(58) Field of Classification Search
None
See application file for complete search history.

(56) References Cited

U.S. PATENT DOCUMENTS

| 6,996,383 | B2 * | 2/2006 | Hughes et al. ................. 455/138 |
| 7,068,987 | B2 * | 6/2006 | Baldwin et al. ............. 455/232.1 |
| 7,415,083 | B2 * | 8/2008 | Anderson ...................... 375/345 |
| 8,331,892 | B2 | 12/2012 | Kadous et al. |
| 2003/0026363 | A1 * | 2/2003 | Stoter et al. .................. 375/345 |
| 2006/0045038 | A1 * | 3/2006 | Kay et al. ...................... 370/316 |
| 2008/0130770 | A1 | 6/2008 | Khandekar et al. |
| 2010/0322117 | A1 | 12/2010 | Gurski et al. |

FOREIGN PATENT DOCUMENTS

| CN | 1504015 A | 6/2004 |
| CN | 1550072 A | 11/2004 |
| CN | 101375510 A | 2/2009 |
| GB | 2381677 A | 5/2003 |
| JP | 2001177426 A | 6/2001 |
| JP | 2001274725 A | 10/2001 |
| JP | 2004512763 A | 4/2004 |
| JP | 2011512077 A | 4/2011 |
| WO | 2007089088 A1 | 8/2007 |
| WO | 2009123830 A1 | 10/2009 |
| WO | 2010004638 A1 | 1/2010 |

OTHER PUBLICATIONS

International Search Report and Written Opinion—PCT/US2011/030805, ISA/EPO—May 26, 2011.

* cited by examiner

*Primary Examiner* — Hassan Kizou
*Assistant Examiner* — Roberta A Shand
(74) *Attorney, Agent, or Firm* — Larry Moskowitz

(57) ABSTRACT

In embodiments, user equipment (UE) is configured to acquire automatic gain control (AGC) of an analog RF front end by maintaining a plurality of M×N AGC loops in which the output of the power detector drives input of a gain state machine after a predetermined delay. Each of the loops corresponds to a different periodic set of tasks of (1/M) subframe in length. In each of the loops, the gain is determined by a power measurement taken ((M×N)+1) tasks ago. A synchronization signal, such as a Primary Synchronization Signal, occurs early in Time Division Duplex (TDD) subframes that follow selected downlink subframes. The periodicity of the selected subframes is N. This allows the UE to converge on proper AGC gain for downlink subframes through a relatively short search, such as a binary search. The UE can then decode the synchronization signal and acquire network timing.

44 Claims, 11 Drawing Sheets

AUTOMATIC GAIN CONTROL ACQUISITION IN TIME DIVISION DUPLEX SYSTEMS

CROSS-REFERENCE TO RELATED APPLICATION

This application claims priority from U.S. Provisional Patent Application Ser. No. 61/320,525, entitled AUTOMATIC GAIN CONTROL ACQUISITION IN TIME DIVISION DUPLEX SYSTEMS, filed on Apr. 2, 2010, which is hereby incorporated by reference in its entirety as if fully set forth herein, including Figures, Tables, and Claims, if present.

BACKGROUND

1. Field

The present invention relates generally to communications. More particularly, in aspects the invention relates to receiver automatic gain control acquisition in time division duplex wireless communication systems.

2. Background

Modern wireless communication systems are widely deployed to provide various types of communication applications, including voice and data applications. These systems may be multiple access systems capable of supporting communications with multiple users by sharing the available system resources (e.g., spectrum and transmit power). Examples of multiple access systems include code division multiple access (CDMA) systems, time division multiple access (TDMA) systems, frequency division multiple access (FDMA) systems, time division duplexing (TDD) systems, frequency division duplexing (FDD) systems, $3^{rd}$ generation partnership project long term evolution (3GPP LTE) systems, and orthogonal frequency division multiple access (OFDMA) systems. There are also point-to-point systems, peer-to-peer systems, wireless local area networks (wireless LANs), and other systems.

Generally, a wireless multiple access communication system can simultaneously support communications with multiple wireless terminals. Each terminal communicates with one or more base transceiver stations (a k a BTSs, base stations, access points, Node Bs) via transmissions on the forward and reverse links. The forward link (FL) or downlink (DL) refers to the communication link from a base transceiver station to a terminal, and the reverse link or uplink refers to the communication link from a terminal to a base transceiver station. Both forward and reverse communication links may be established via single-in-single-out (SISO), multiple-in-single-out (MISO), single-in-multiple-out (SIMO), or multiple-in-multiple-out (MIMO) communication techniques, depending on the number of transmitting antennas and receiving antennas used for the particular link.

MIMO systems are of particular interest because of their relatively higher data rates, relatively longer coverage range, and relatively more reliable data transmission. A MIMO system employs multiple ($N_T$) transmit antennas and multiple ($N_R$) receive antennas for data transmission. A MIMO channel formed by the $N_T$ transmit and $N_R$ receive antennas may be decomposed into $N_S$ independent channels (also referred to as spatial channels), where $N_S \leq \min\{N_T, N_R\}$. Each of the $N_S$ independent channels corresponds to a dimension. MIMO systems can provide improved performance (e.g., higher throughput and/or improved robustness) if the additional dimensions created by the multiple transmit and receive antennas are used.

MIMO techniques may support both TDD and FDD systems. In a TDD system, the forward and reverse link transmissions are in the same frequency band. In an FDD system, different frequency bands may be used for forward and reverse link transmissions.

In many wireless communication systems, a receiving device, such as a mobile device or user equipment (UE), determines estimates of the forward link physical channel between itself and a base station. The forward link physical channel estimates may be used to demodulate the signal the UE receives from the base station, for adaptive power control, and/or for other functions.

In UEs, downlink channel estimates are typically obtained from pilot signals or simply pilots. A pilot is a reference signal known a priori to a particular UE (and possibly to all UEs or a subset of all UEs). In addition to the pilots used for channel estimation and demodulation, there may be synchronization signals that allow the UEs to acquire system timing on power up. Such signals, known as Primary and Secondary Synchronization Signals (PSS and SSS, respectively) are also known a priori.

The dynamic range of received signals at a UE's antenna may be quite large. Typically, a UE needs to accommodate about 100 dB of signal power variation. At the same time, the dynamic range determined by the bit-width of the UE's analog-to-digital converter (ADC) is typically about 90 dB. Additionally, about 65 dB of the ADC's dynamic range may be needed to provide operating margin and to accommodate various effects, such as carrier-to-interference ratio, channel variation due to Raleigh fading, shadowing, I/Q ratio, peak-to-average ratio, and quantization noise. To accommodate the difference between the needed dynamic range and the dynamic range available at the ADC, several AGC states may be used to vary the analog radio frequency (RF) gain in the front end of the UE's receiver. The analog RF gain may be (or may include) the gain of a low noise amplifier (LNA). Each AGC state may correspond to a predetermined analog RF gain; the states may increase with an increment of a predetermined size, for example, 10 or 15 dB.

Proper DL reception requires the AGC to be in an appropriate state (or one of a few appropriate states), so that the signal level at the ADC input falls within an acceptable range. Once the DL signal is acquired, the AGC state may be adjusted in a closed loop (feedback-controlled) manner. In the case of FDD, where only DL frames are transmitted on a given DL frequency, the AGC state may also be acquired in a closed loop manner, even before network timing is known.

In the case of TDD, however, AGC acquisition is more complicated, because both DL and UL subframes of 1 ms may be present within a single 10 ms frame. In TDD, the AGC acquisition problem is more difficult to deal with, because the UE does not have the information regarding boundaries of subframes or which subframes are DL subframes, and because the dynamic range of even adjacent subframes can exceed 100 dB. For cell edge operation, for example, the DL signal may be quite weak, while another UE can be located nearby and transmit at full power on the UL—at the same frequency and within the same frame. In essence, the UL subframes may interfere with AGC acquisition.

One way solve this problem is for a receiver (e.g., UE) to use a given gain state (e.g., "1"), to try to acquire the system. If the acquisition attempt fails in the selected gain state, then the receiver may repeat sequentially for other gain states (e.g., gain state 2, gain state 3, and so on), until the system is successful acquired. This brute-force approach may take a long time, particularly if the appropriate AGC state is the last state in the sequence of states that the AGC is programmed to try sequentially.

A need thus exists in the art for apparatus, methods, and articles of manufacture that reduce the time for AGC acquisition in TDD systems. A further need exists for apparatus, methods, and articles of manufacture that reduce expenditure of UE power and computational resources during AGC acquisition in TDD systems.

SUMMARY

In view of the above, embodiments disclosed herein may address the above stated needs by providing apparatus, methods, and/or articles of manufacture for configuring user equipment to acquire automatic gain control of analog RF front end by maintaining a plurality of (M×N) AGC loops in which the output of the power detector drives input of an analog RF gain state machine, possibly after a predetermined delay. Each of the loops corresponds to a different periodic set of tasks of a fractional portion of subframe in length. The subframes are divided into equal portions so that there are M (M>1) fractional portions per subframe. In each of the loops, the analog RF gain is determined by a power measurement taken k≥0 tasks ago. Here, N designates the subframe periodicity of a synchronization signal within the frames, and k is an integer, e.g., 1. For LTE, for example, the synchronization signal may be the Primary Synchronization Signal (PSS), which occurs early in Time Division Duplex subframes 1 and 6. Thus, N may be equal to five for LTE. Note that subframes 0 and 5 are down link subframes, so 0ne of the loops of the UE can converge on proper AGC gain for downlink subframes, and detect/decode the PSS to acquire network timing.

The numerology described above for LTE systems is exemplary. The embodiments described in this document are not limited to LTE or to the specific numerology described.

In an embodiment, a wireless communication method includes these steps (1) receiving at a user equipment (UE) a received signal comprising frames, each of the frames comprising subframes; (2) configuring at the UE a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks; (3) operating said each AGC loop; (4) correlating the received signal with a known synchronization signal to detect a pattern of the known synchronization signal within the received signal; and (5) determining, in response to detection of the pattern of the known synchronization signal within the received signal, subframe timing of the received signal. The UE may then continue to operate with the acquired AGC, for example, decoding information in the received signal and providing the decoded information to a user (rendering, playing, displaying, storing, transferring the information).

In an embodiment, computer program product includes non-transitory computer-readable storage with embedded code comprising (1) c code for receiving at a user equipment (UE) a received signal comprising frames, each of the frames comprising subframes; (2) code for configuring at the UE a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks; (3) code for operating said each AGC loop; (4) code for correlating the received signal with a known synchronization signal to detect a pattern of the known synchronization signal within the received signal; (5) code for determining, in response to detection of the pattern of the known synchronization signal within the received signal, subframe timing of the received signal; and (6) code for switching the UE to tracking mode AGC operation in response to determination of the subframe timing.

In an embodiment, wireless user equipment (UE) comprises at least one receiver and at least one processor. The user equipment is configured to perform steps comprising: (1) receiving a received signal comprising frames, each of the frames comprising subframes; (2) configuring at the UE a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks; (3) operating said each AGC loop; (4) correlating the received signal with a known synchronization signal to detect a pattern of the known synchronization signal within the received signal; and (5) in response to detection of the pattern of the known synchronization signal within the received signal, determining subframe timing of the received signal.

In an embodiment, wireless user equipment (UE) includes: (1) a receiver configured to receive a received signal comprising frames, each of the frames comprising subframes; (2) means for operating a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks; (3) a correlator configured to detect a pattern of a synchronization signal within the received signal; and (4) a subframe timing circuit configured to determine timing of the received signal in response to detection of the pattern of the synchronization signal within the received signal.

In an embodiment, a processor is configured to perform steps including: (1) receiving at a user equipment (UE) a received signal comprising frames, each of the frames comprising subframes; (2) configuring at the UE a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks; (3) operating said each AGC loop; (4) correlating the received signal with a known synchronization signal to detect a pattern of the known synchronization signal within the received signal; (5) in response to detection of the pattern of the synchronization signal within the received signal, determining subframe timing of the received signal; and (6) switching the UE to tracking mode AGC operation in response to determination of the subframe timing.

Further scope of the applicability of the present method, apparatus, and articles of manufacture will become apparent from the following detailed description, claims, and drawings. It may be understood, however, that the detailed description and specific examples, while indicating one or more preferred embodiments of the invention, are given by way of illustration only, since various changes and modifications within the spirit and scope of the invention will become apparent to those skilled in the art.

DETAILED DESCRIPTION

Figure 1:
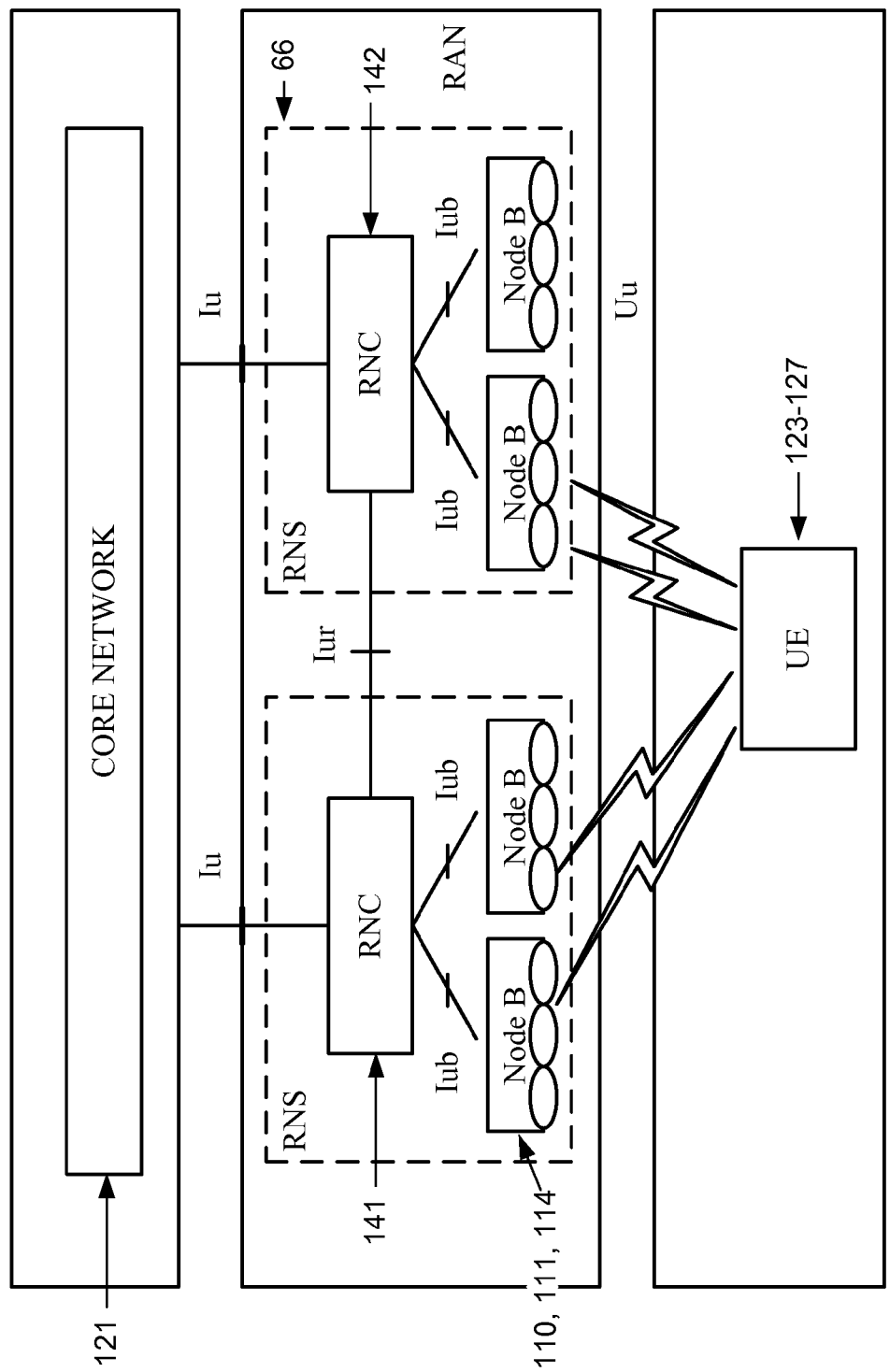
FIG. 1 is a block diagram of a radio access system having two radio network subsystems along with its interfaces to the core and the user equipment.

Certain aspects of the techniques are described in this document with reference to LTE, and consequently LTE terminology may be used in the description below. But the techniques are applicable to other standards and technologies.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the present invention. However, it will be apparent to those skilled in the art that the present invention may be practiced without these specific details. In some instances, well known structures and devices are shown in block diagram form in order to avoid obscuring the concepts of the present invention.

The words "embodiment," "variant," "implementation," "example," and similar expressions are used to refer to a particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expressions "alternative embodiment," "alternatively," and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

"Pilot" and "pilot reference" are used interchangeably to indicate transmission of a known symbol or known symbols for purposes such as receiver-transmitter synchronization and channel estimation. Pilots are generally used for channel estimation, demodulation, and related functions. "Primary Synchronization Signal" and "Secondary Synchronization Signal" ("PSS" and "SSS") are signals known a priori and used for synchronizing UEs with the network.

A number (e.g., N) referred to as the guaranteed downlink or DL subframe periodicity within a frame signifies that every Nth subframe within a frame is guaranteed to be a downlink subframe, with the same positions of the guaranteed downlink subframes relative to their respective frames. For example, there may be ten subframes per frame, numbered consecutively from 0 to 9. If every subframe 0 and every subframe 5 are guaranteed to be downlink subframes, then the guaranteed DL subframe periodicity within a frame is 5 (N=5), because every fifth subframe (subframes 0 and 5) is a downlink subframe. Note that this periodicity does not prevent any of the other subframes (1-4 and 6-9) from being downlink subframes.

The techniques described in this document are not necessarily limited to OFDM and OFDMA networks, but in aspects may be used for various other wireless communication networks, including CDMA networks, TDMA networks, and FDMA networks. The terms "networks" and "systems" are often used interchangeably. A CDMA network may implement a radio technology such as Universal Terrestrial Radio Access (UTRA), cdma2000, and other technologies. UTRA networks include Wideband-CDMA (W-CDMA) and Low Chip Rate (LCR) networks. The cdma2000 designation refers to IS-2000, IS-95 and IS-856 standards. TDMA networks may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM, and other technologies. Universal Terrestrial Radio Access, E-UTRA, and GSM are parts of Universal Mobile Telecommunication System (UMTS). Long Term Evolution (LTE) is a release of UMTS that uses E-UTRA. The UTRA, E-UTRA, GSM, UMTS and LTE system standards are described in documents from an organization named "3rd Generation Partnership Project" (3GPP). The cdma2000 standard is described in documents from an organization named "3rd Generation Partnership Project 2" (3 GPP2).

Further described herein with reference to FIGS. 1-5 is an example of a radio network 100 operating according to UMTS which can be configured to apply the principles of the present disclosure. Node Bs 110, 111, 114 and radio network controllers 141-144 are parts of a network called "radio network," "RN," "access network," or "AN." The radio network may be a UMTS Terrestrial Radio Access Network (UTRAN). A UMTS Terrestrial Radio Access Network is a collective term for the Node Bs (or base stations) and the control equipment for the Node Bs (or radio network controllers (RNCs)) it contains which make up the UMTS radio access network. This may be a 3 G communications network which can carry both real-time circuit switched and IP based packet switched traffic. The UTRAN provides an air interface access method for the user equipment (UE) 123-127. Connectivity is provided between the UEs and the core network by the UTRAN. The radio network may transport data packets between multiple user equipment devices 123-127.

The UTRAN is connected internally or externally to other functional entities by four interfaces: Iu, Uu, Iub and Iur. The UTRAN is attached to a GSM core network 121 via an external interface called Iu. Radio network controller 141-144 (shown in FIG. 2), of which 141, 142 are shown in FIG. 1, supports this interface. In addition, the RNC manages a set of base stations called Node Bs through interfaces labeled Iub. The Iur interface connects two RNCs 141-144 with each other. The UTRAN is largely autonomous from the core network 121 since the RNCs 141-144 are interconnected by the Iur interface. FIG. 1 discloses a communication system which uses the RNC, the Node Bs and the Iu and Uu interfaces. The Uu is also external and connects the Node B with the UE, while the Iub is an internal interface connecting the RNC with the Node B.

The radio network may be further connected to additional networks outside the radio network, such as a corporate intranet, the Internet, or a conventional public switched telephone network as stated above, and may transport data packets between each user equipment device 123-127 and such outside networks.

Figure 2:
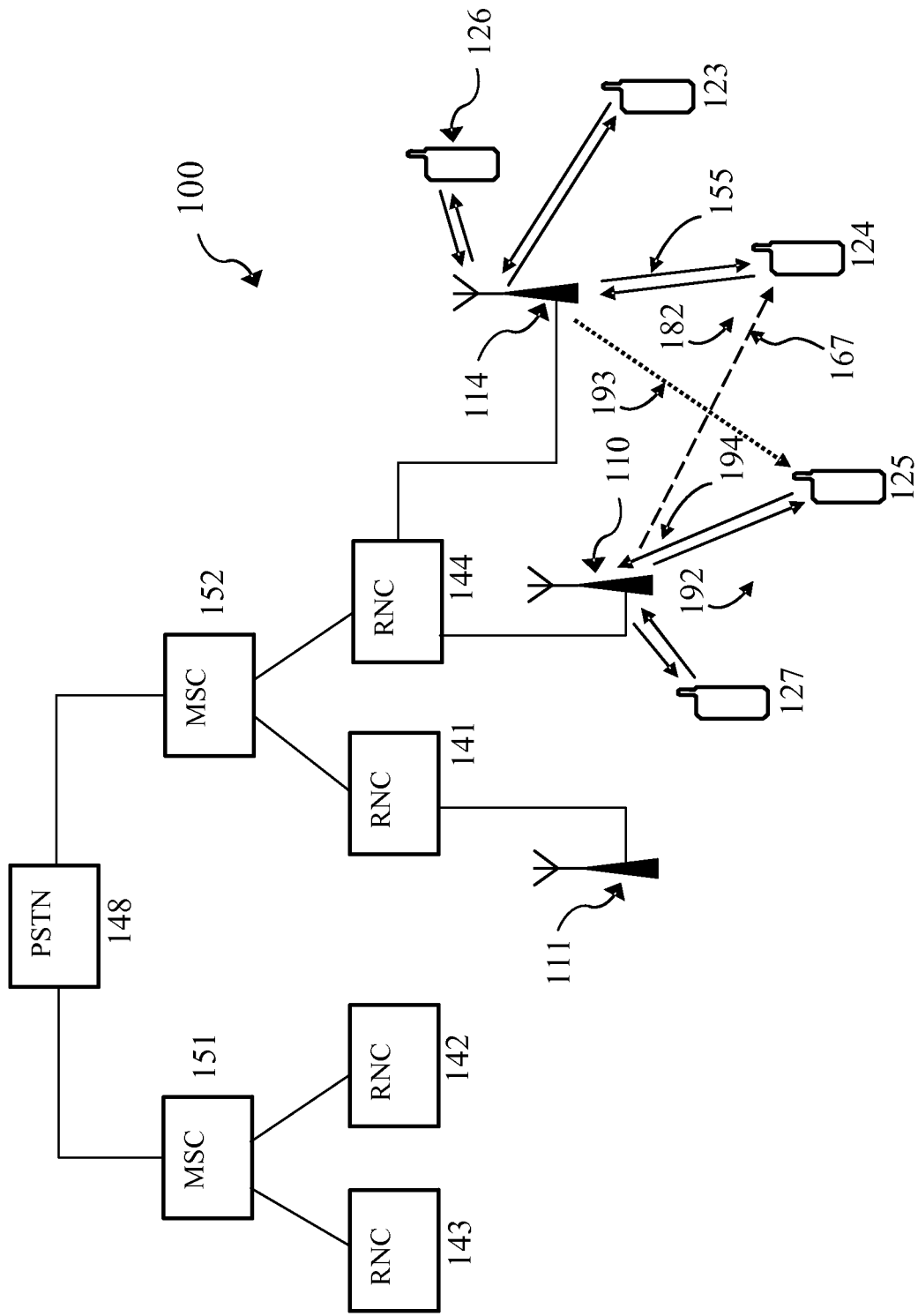
FIG. 2 is a simplified representation of a cellular communications system.

FIG. 2 illustrates selected components of the network 100, which includes a radio network controller (or base station controller, BSC) 141-144 coupled to Node Bs (or base stations or wireless base transceiver stations) 110, 111, and 114. The Node Bs 110, 111, 114 communicate with user equipment (or remote stations) 123-127 through corresponding wireless connections 155, 167, 182, 192, 193, 194. A communications channel includes a forward link (FL, also known as a downlink) for transmissions from the Node B 110, 111, 114 to the user equipment (UE) 123-127, and a reverse link (RL, also known as an uplink) for transmissions from the UE 123-127 to the Node B 110, 111, 114. The RNC 141-144 provides control functionalities for one or more Node Bs. The radio network controller 141-144 is coupled to a public switched telephone network (PSTN) 148 through a mobile switching center (MSC) 151, 152. In another example, the radio network controller 141-144 is coupled to a packet switched network (PSN) (not shown) through a packet data server node (PDSN, not shown). Data interchange between various network elements, such as the radio network controller 141-144 and a packet data server node, can be implemented using any number of protocols, for example, the Internet Protocol (IP), an asynchronous transfer mode (ATM) protocol, T1, E1, frame relay, and other protocols.

The RNC fills multiple roles. First, it may control the admission of new mobiles or services attempting to use the Node B. Second, from the Node B, or base station, point of view, the RNC is a controlling RNC. Controlling admission ensures that mobiles are allocated radio resources (bandwidth and signal/noise ratio) up to what the network has available. It is where the Node B's Iub interface terminates. From the UE, or mobile, point of view, the RNC acts as a serving RNC in which it terminates the mobile's link layer communications. From a core network point of view, the serving RNC terminates the Iu for the UE. The serving RNC also controls the admission of new mobiles or services attempting to use the core network over its Iu interface.

W-CDMA

For an air interface, UMTS commonly uses a wideband spread-spectrum mobile air interface known as wideband code division multiple access (W-CDMA). W-CDMA uses a direct sequence code division multiple access signaling method (or CDMA) to separate users. Wideband Code Division Multiple Access is a third generation standard for mobile communications. Wideband Code Division Multiple Access evolved from GSM (Global System for Mobile Communications)/GPRS, a second generation standard, which is oriented to voice communications with limited data capability. The first commercial deployments of W-CDMA were based on a version of the standards called W-CDMA Release 99.

The Release 99 specification defines two techniques to enable uplink packet data. Most commonly, data transmission is supported using either the Dedicated Channel (DCH) or the Random Access Channel (RACH). However, the DCH is the primary channel for support of packet data services. Each remote station 123-127 uses an orthogonal variable spreading factor (OVSF) code. An OVSF code is an orthogonal code that facilitates uniquely identifying individual communication channels, as will be appreciated by one skilled in the art. In addition, micro diversity is supported using soft handover and closed loop power control is employed with the DCH.

Pseudorandom noise (PN) sequences are commonly used in CDMA systems for spreading transmitted data, including transmitted pilot signals. The time required to transmit a single value of the PN sequence is known as a chip, and the rate at which the chips vary is known as the chip rate. Inherent in the design of direct sequence CDMA systems is the requirement that a receiver aligns its PN sequences to those of the Node B 110, 111, 114. Some systems, such as those defined by the W-CDMA standard, differentiate base stations 110, 111, 114 using a unique PN code for each, known as a primary scrambling code. The W-CDMA standard defines two Gold code sequences for scrambling the downlink, one for the in-phase component (I) and another for the quadrature (Q) component. The I and Q PN sequences together are broadcast throughout the cell without data modulation. This broadcast is referred to as the common pilot channel (CPICH). The PN sequences generated are truncated to a length of 38,400 chips. The period of 38,400 chips is referred to as a radio frame. Each radio frame is divided into 15 equal sections referred to as slots. W-CDMA Node Bs 110, 111, 114 operate asynchronously in relation to each other, so knowledge of the frame timing of one base station 110, 111, 114 does not translate into knowledge of the frame timing of any other Node B 110, 111, 114. In order to acquire this knowledge, W-CDMA systems use synchronization channels and a cell searching technique.

HSPA

3GPP Release 5 and later support High-Speed Downlink Packet Access (HSDPA). 3GPP Release 6 and later support High-Speed Uplink Packet Access (HSUPA). HSDPA and HSUPA are sets of channels and procedures that enable high-speed packet data transmission on the downlink and uplink, respectively. Release 7 HSPA+ uses 3 enhancements to improve data rate. First, it introduced support for 2×2 MIMO on the downlink. With MIMO, the peak data rate supported on the downlink is 28 Mbps. Second, higher order modulation is introduced on the downlink. The use of 64 QAM on the downlink allows peak data rates of 21 Mbps. Third, higher order modulation is introduced on the uplink. The use of 16 QAM on the uplink allows peak data rates of 11 Mbps.

In HSUPA, the Node B 110, 111, 114 allows several user equipment devices 123-127 to transmit at a certain power level at the same time. These grants are assigned to users by using a fast scheduling algorithm that allocates the resources on a short-term basis (tens of ms). The rapid scheduling of HSUPA is well suited to the bursty nature of packet data. During periods of high activity, a user may get a larger percentage of the available resources, while getting little or no bandwidth during periods of low activity.

In 3GPP Release 5 HSDPA, a base transceiver station 110, 111, 114 of an access network sends downlink payload data to user equipment devices 123-127 on High Speed Downlink Shared Channel (HS-DSCH), and the control information associated with the downlink data on High Speed Shared Control Channel (HS-SCCH). There are 256 Orthogonal Variable Spreading Factor (OVSF or Walsh) codes used for data transmission. In HSDPA systems, these codes are partitioned into release 1999 (legacy system) codes that are typically used for cellular telephony (voice), and HSDPA codes that are used for data services. For each transmission time interval (TTI), the dedicated control information sent to an HSDPA-enabled user equipment device 123-127 indicates to the device which codes within the code space will be used to send downlink payload data to the device, and the modulation that will be used for transmission of the downlink payload data.

With HSDPA operation, downlink transmissions to the user equipment devices 123-127 may be scheduled for different transmission time intervals using the 15 available HSDPA OVSF codes. For a given TTI, each user equipment device 123-127 may be using one or more of the 15 HSDPA codes, depending on the downlink bandwidth allocated to the device during the TTI. As has already been mentioned, for each TTI the control information indicates to the user equipment device 123-127 which codes within the code space will be used to send downlink payload data (data other than control data of the radio network) to the device, and the modulation that will be used for transmission of the downlink payload data.

MIMO

In a MIMO system, there are N (# of transmitter antennas) by M (# of receiver antennas) signal paths between the transmit and the receive antennas, and the signals on these paths are not identical. MIMO creates multiple data transmission pipes. The pipes are orthogonal in the space-time domain. The number of pipes equals the rank of the system. Since these pipes are orthogonal in the space-time domain, they create little interference with each other. The data pipes are realized with proper digital signal processing by properly combining signals on O×P paths. It is noted that a transmission pipe does not correspond to an antenna transmission chain or any one particular transmission path.

Communication systems may use a single carrier frequency or multiple carrier frequencies. Each link may incorporate a different number of carrier frequencies. Furthermore, an access terminal 123-127 may be any data device that communicates through a wireless channel or through a wired channel, for example using fiber optic or coaxial cables. An access terminal 123-127 may be any of a number of types of devices including but not limited to PC card, compact flash, external or internal modem, or wireless or wireline phone. The access terminal 123-127 may also be known as user equipment (UE), a remote station, a mobile station or a subscriber station. Also, the UE 123-127 may be mobile or stationary.

User equipment 123-127 that has established an active traffic channel connection with one or more Node Bs 110, 111, 114 is called active user equipment 123-127, and is said to be in a traffic state. User equipment 123-127 that is in the process of establishing an active traffic channel connection with one or more Node Bs 110, 111, 114 is said to be in a connection setup state. User equipment 123-127 may be any data device that communicates through a wireless channel or through a wired channel, for example using fiber optic or coaxial cables. The communication link through which the user equipment 123-127 sends signals to the Node B 110, 111, 114 is called an uplink. The communication link through which the Node B 110, 111, 114 sends signals to the user equipment 123-127 is called a downlink.

Figure 3:
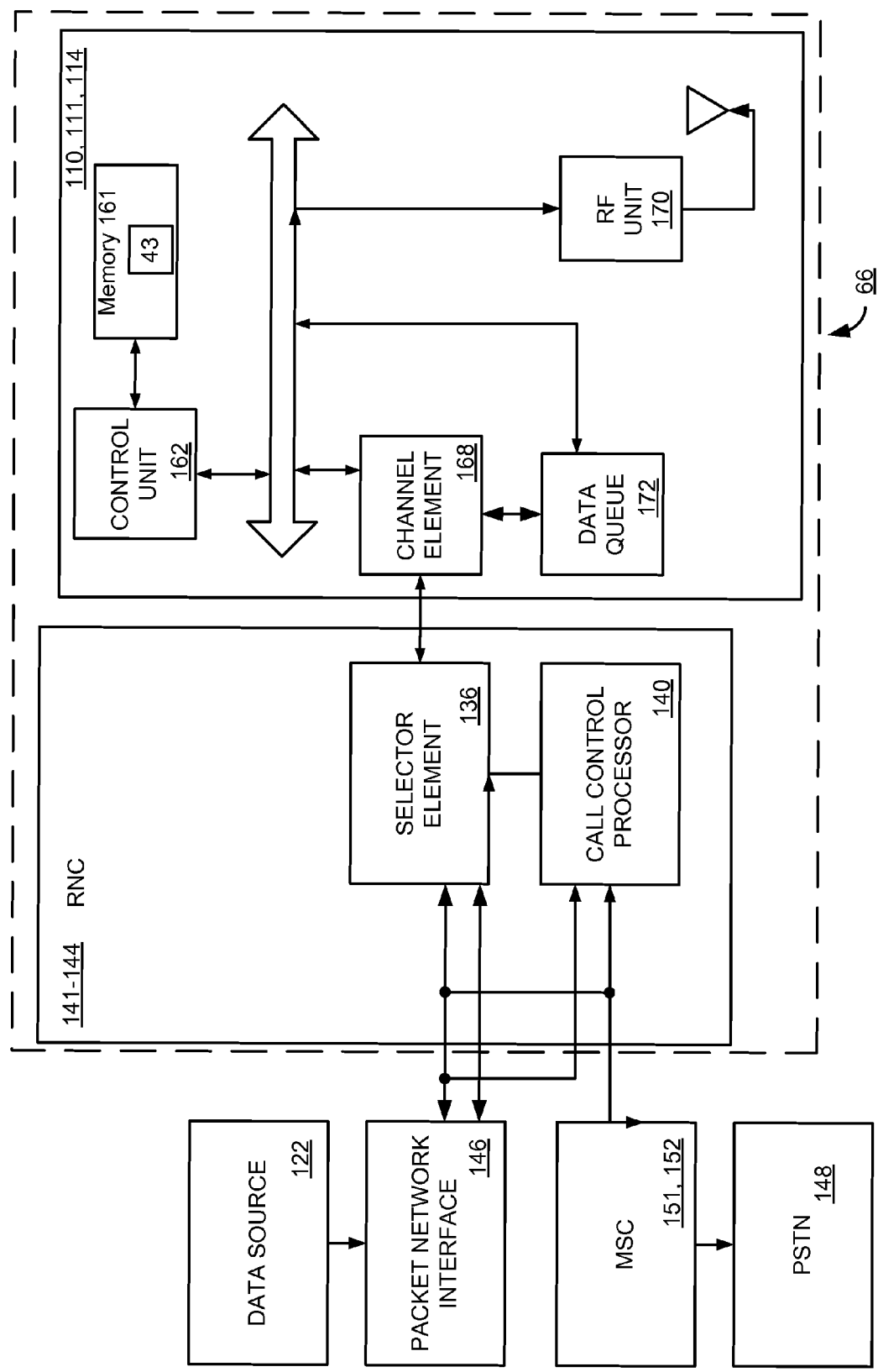
FIG. 3 is detailed herein below, wherein specifically, a Node B and radio network controller interface with a packet network interface; is a portion of a communication system, including a radio network controller and a Node B.

FIG. 3 is detailed herein below, wherein specifically, a Node B 110, 111, 114 and radio network controller 141-144 interface with a packet network interface 146. (In FIG. 3, only one Node B 110, 111, 114 is shown for simplicity.) The Node B 110, 111, 114 and radio network controller 141-144 may be part of a radio network server (RNS) 66, shown in FIG. 1 and in FIG. 3 as a dashed line surrounding one or more Node Bs 110, 111, 114 and the radio network controller 141-144. The associated quantity of data to be transmitted is retrieved from a data queue 172 in the Node B 110, 111, 114 and provided to the channel element 168 for transmission to the user equipment 123-127 associated with the data queue 172.

Radio network controller 141-144 interfaces with a Public Switched Telephone Network (PSTN) 148 through a mobile switching center 151, 152. Also, radio network controller 141-144 interfaces with Node Bs 110, 111, 114 in the communication system 100. In addition, radio network controller 141-144 interfaces with a Packet Network Interface 146. Radio network controller 141-144 coordinates the communication between user equipment 123-127 in the communication system and other users connected to packet network interface 146 and PSTN 148. PSTN 148 interfaces with users through a standard telephone network (not shown in FIG. 3).

Radio network controller 141-144 may contain many selector elements 136, although only one is shown in FIG. 3 for simplicity. Each selector element 136 is assigned to control communication between one or more Node Bs 110, 111, 114 and one remote station 123-127 (not shown in FIG. 3). If a selector element 136 has not been assigned to a given user equipment 123-127, call control processor 140 is informed of the need to page the user equipment 123-127. Call control processor 140 then directs the Node B 110, 111, 114 to page the user equipment 123-127.

Data source 122 contains a quantity of data, which is to be transmitted to a given user equipment 123-127. Data source 122 provides the data to packet network interface 146. Packet network interface 146 receives the data and routes the data to the selector element 136. Selector element 136 then transmits the data to Node B 110, 111, 114 in communication with the target user equipment 123-127. In the exemplary embodiment, each Node B 110, 111, 114 maintains a data queue 172, which stores the data to be transmitted to the user equipment 123-127.

For each data packet, channel element 168 inserts the control fields. In an exemplary embodiment, channel element 168 performs a cyclic redundancy check (CRC), encoding of the data packet and control fields and inserts a set of code tail bits. The data packet, control fields, CRC bits, and code tail bits comprise a formatted packet. In an exemplary embodiment, channel element 168 then encodes the formatted packet and interleaves (or reorders) the symbols within the encoded packet. In the exemplary embodiment, the interleaved packet is covered with a Walsh code, and spread with the short PNI and PNQ codes. The spread data is provided to RF unit 170 which quadrature modulates, filters, and amplifies the signal. The downlink signal is transmitted over the air through one or more antennas.

At the user equipment 123-127, the downlink signal is received by one or more antennas and routed to a receiver. The receiver filters, amplifies, quadrature demodulates, and quantizes the signal. The digitized signal is provided to a demodulator (DEMOD) where it is despread with the short PNI and PNQ codes and decovered with the Walsh cover. The demodulated data is provided to a decoder which performs the inverse of the signal processing functions done at Node B 110, 111, 114, specifically the de-interleaving, decoding, and CRC check functions. The decoded data is provided to a data sink.

Figure 4:
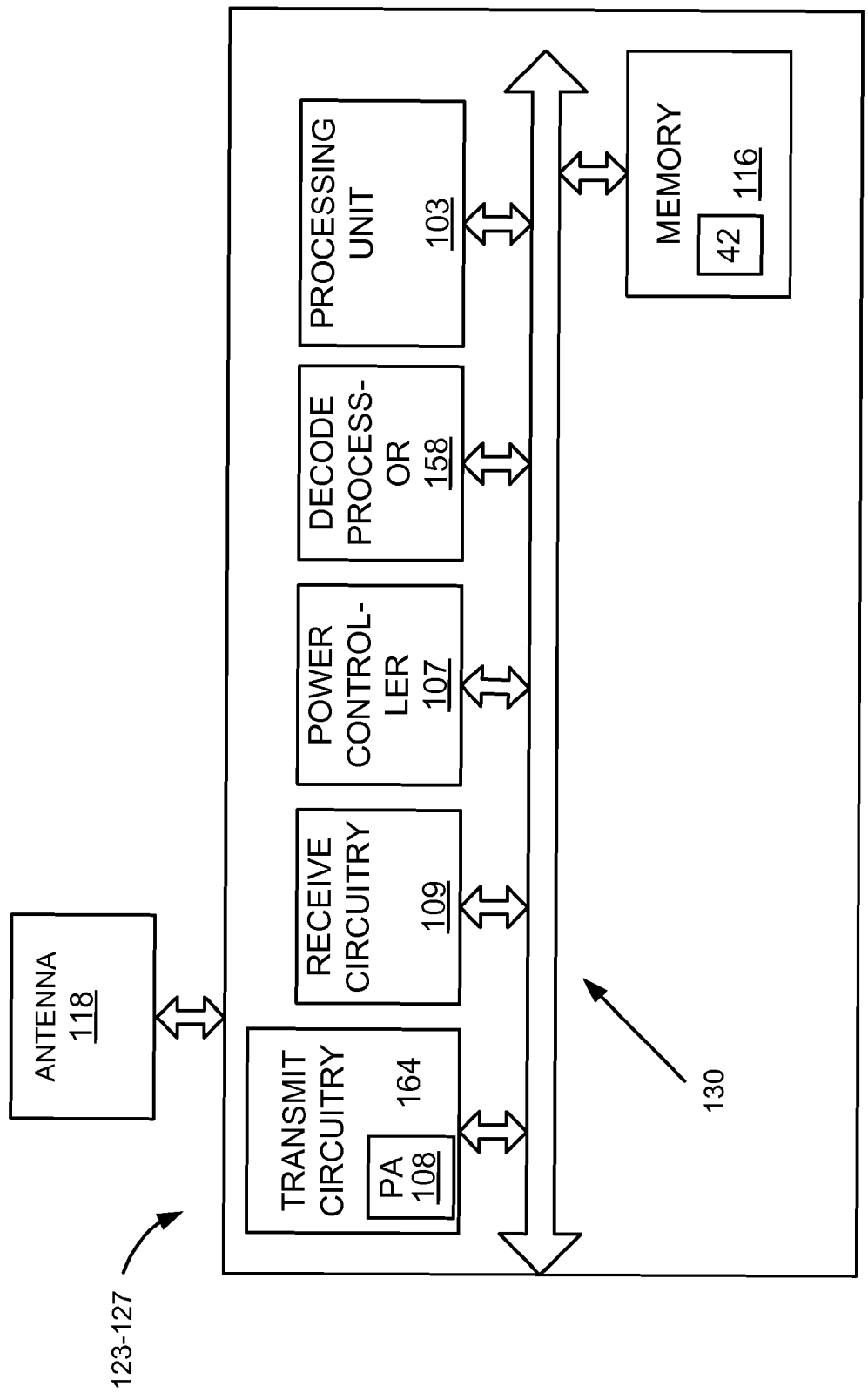
FIG. 4 is a block diagram of user equipment (UE)

FIG. 4 illustrates an embodiment of a user equipment 123-127 in which the UE 123-127 includes transmit circuitry 164 (including PA 108), receive circuitry 109, power controller 107, decode processor 158, a processing unit 103 for use in processing signals, and memory 116. The transmit circuitry 164 and a receive circuitry 109 may allow transmission and reception of data, such as audio communications, between the UE 123-127 and a remote location. The transmit circuitry 164 and receive circuitry 109 may be coupled to an antenna 118.

The processing unit 103 controls operation of the UE 123-127. The processing unit 103 may also be referred to as a CPU. Memory 416, which may include both read-only memory (ROM) and random access memory (RAM), provides instructions and data to the processing unit 103. A portion of the memory 116 may also include non-volatile random access memory (NVRAM).

The various components of the UE 123-127 are coupled together by a bus system 130 which may include a power bus, a control signal bus, and a status signal bus in addition to a data bus. However, for the sake of clarity, the various busses are illustrated in FIG. 4 as the bus system 130.

The steps of the methods discussed may also be stored as instructions in the form of software or firmware 43 located in memory 161 in the Node B 110, 111, 114, as shown in FIG. 3. These instructions may be executed by the control unit 162 of the Node B 110, 111, 114 in FIG. 3. Alternatively, or in conjunction, the steps of the methods discussed may be stored as instructions in the form of software or firmware 42 located in memory 116 in the UE 123-127. These instructions may be executed by the processing unit 103 of the UE 123-127 in FIG. 4.

Figure 5:
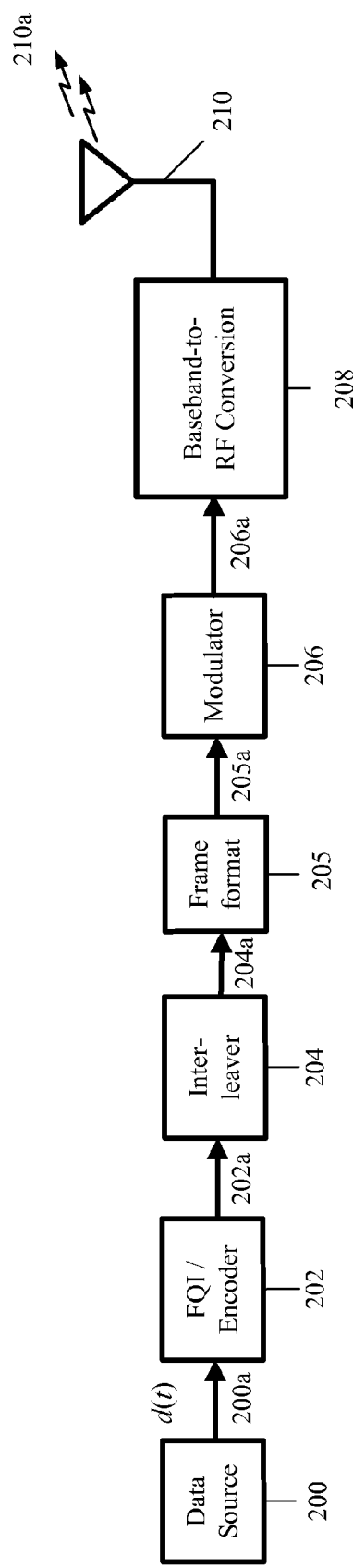
FIG. 5 is a functional block flow diagram of signals through structures of a transmitter.

FIG. 5 illustrates an example of a transmitter structure and/or process, which may be implemented, e.g., at user equipment 123-127. The functions and components shown in FIG. 5 may be implemented by software, hardware, or a combination of software and hardware. Other functions may be added to FIG. 5 in addition to or instead of the functions shown in FIG. 5.

In FIG. 5, a data source 200 provides data d(t) or 200a to an FQI/encoder 202. The FQI/encoder 202 may append a frame quality indicator (FQI) such as cyclic redundancy check to the data d(t). The FQI/encoder 202 may further encode the data and FQI using one or more coding schemes to provide encoded symbols 202a. Each coding scheme may include one or more types of coding, e.g., convolutional coding, Turbo coding, block coding, repetition coding, or other types of coding. Other coding schemes may include automatic repeat request (ARQ), hybrid ARQ (H-ARQ), and incremental redundancy repeat techniques. Different types of data may be encoded with different coding schemes. In examples, no coding is used at all.

An interleaver 204 interleaves the encoded data symbols 202a in time, to combat fading, and generates symbols 204a. The interleaved symbols of signal 204a may be mapped by a frame format block 205 to a pre-defined frame format, to produce a frame 205a. In an example, a frame format may specify the frame as being composed of a plurality of sub-segments. In an example, sub-segments may be any successive portions of a frame along a given dimension, e.g., time, frequency, code, or any other dimension. A frame may be composed of a fixed plurality of such sub-segments, each sub-segment containing a portion of the total number of symbols allocated to the frame. In an example according to the W-CDMA standard, a sub-segment may be defined as a slot. In an example according to the cdma2000 standard, a sub-segment may be defined as a power control group (PCG). In one example, the interleaved symbols 204a are segmented into a plurality S of sub-segments making up the frame 205a.

In certain examples, a frame format may further specify the inclusion of, e.g., control symbols (not shown) along with the interleaved symbols 204a. Such control symbols may include, e.g., power control symbols, frame format information symbols, and other symbols.

A modulator 206 modulates the frame 205a to generate modulated data 206a. Examples of modulation techniques include binary phase shift keying (BPSK) and quadrature phase shift keying (QPSK). The modulator 206 may also repeat a sequence of modulated data.

A baseband-to-radio-frequency (RF) conversion block 208 may convert the modulated signal 206a to RF signals for transmission via an antenna 210 as signal 210a, over a wireless communication link to one or more Node B station receivers.

In examples, the system 100 is configured to operate under the LTE standard.

Figure 6:
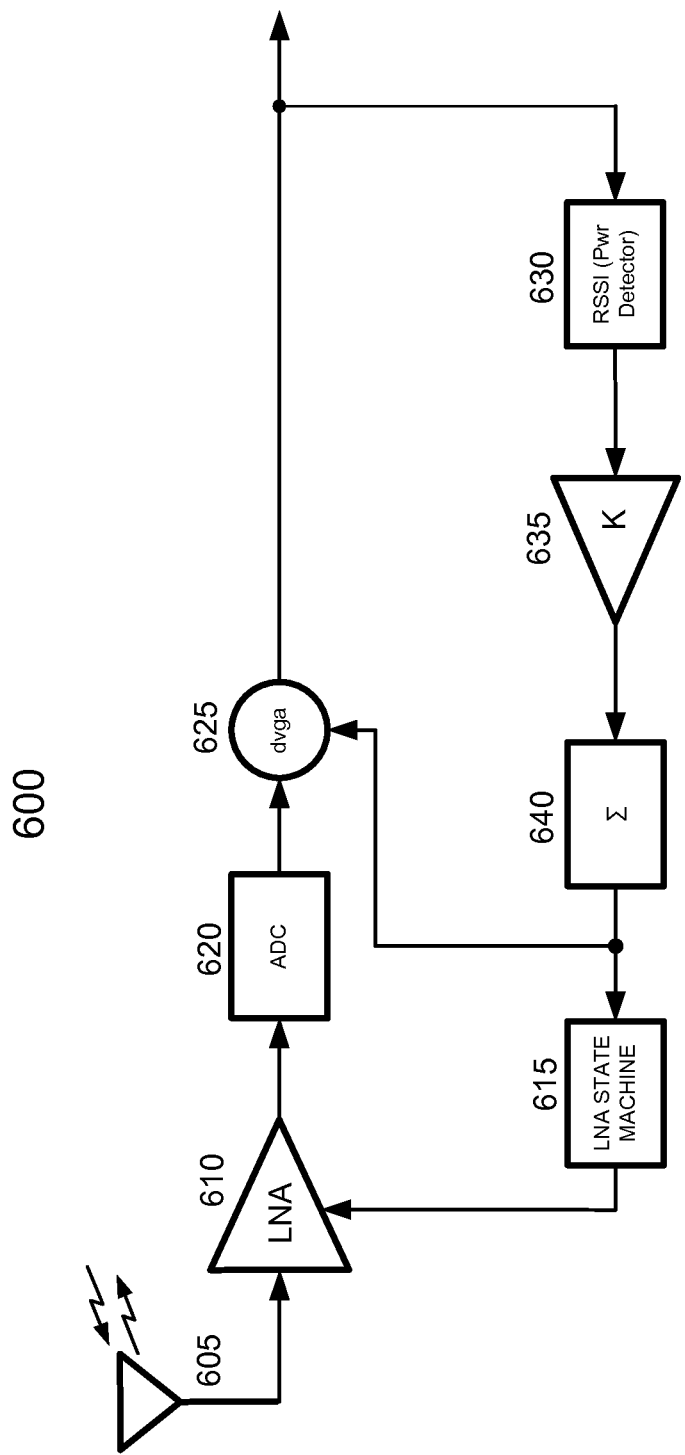
FIG. 6 illustrates selected elements of an AGC loop in tracking mode.

FIG. 6 illustrates selected front end components 600 of an exemplary receiver of a UE, such as one of the UEs 123-127. The front end components 600 relate to the operation of AGC. They include an antenna 605; an LNA 610 whose gain is controlled by an LNA state machine 615 that computes in a deterministic manner the next LNA gain state based on the current input into the state machine 615 (and possibly also based on the history of the input); an ADC 620; a digital voltage gain amplifier (dvga) 625 that amplifies the received magnitude signal in the digital domain with variable gain (or equivalently, divides the magnitude signal with a variable divisor); a power detector 630; a loop gain block 635; and an accumulator (summer/integrator) 640. These components may be arranged as shown in FIG. 6. The output of the accumulator 640 is split into two parts. The first part is fed into the input of the LNA state machine 615. The output of the LNA state machine 615 controls the gain of the LNA 610. This is the "outer loop." The second part controls the gain of the dvga 625; this is the "inner loop."

It is noted that the LNA 610 is used as a specific example of a more general approach using a variable analog RF amplification module.

Figure 7:
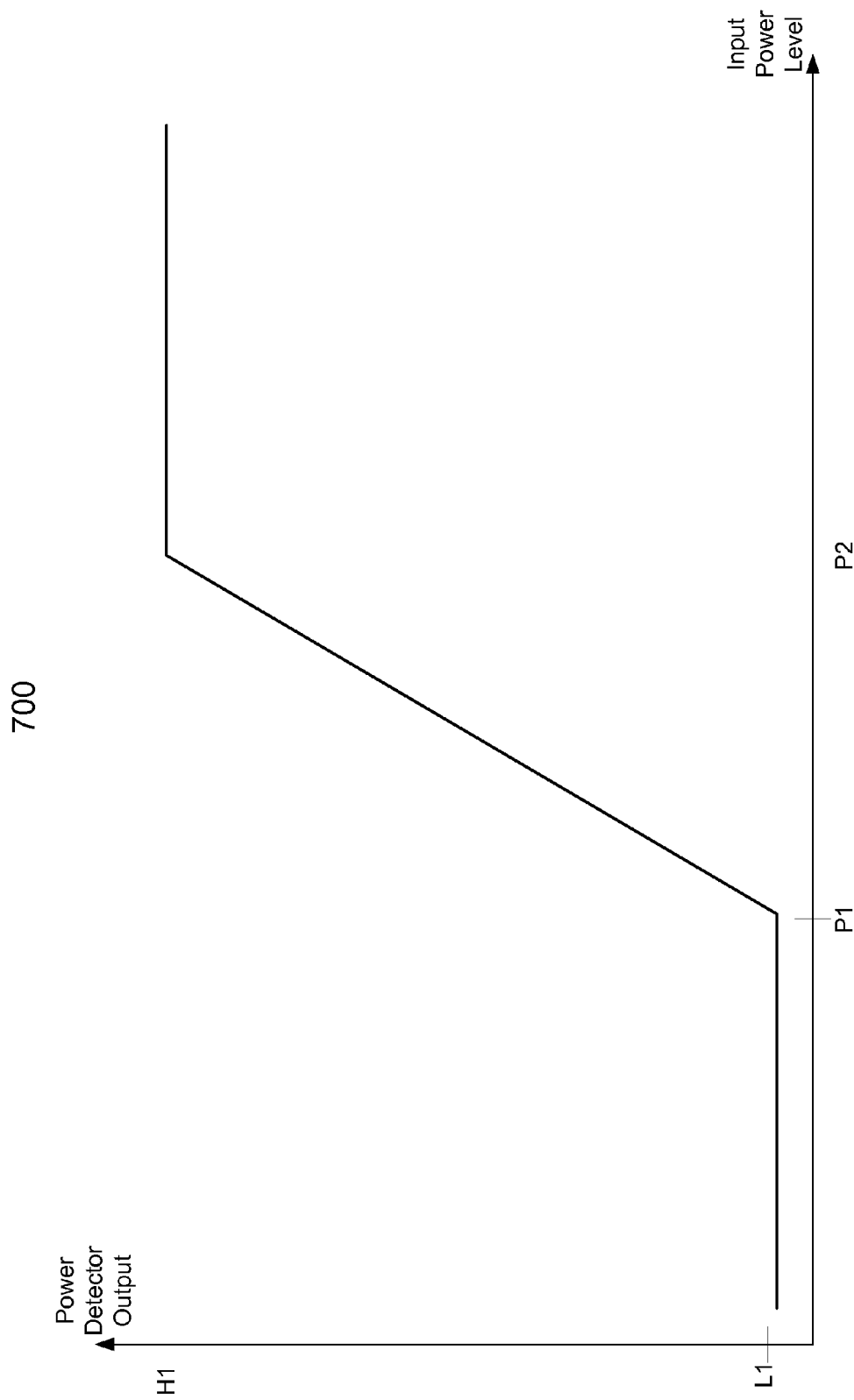
FIG. 7 illustrates selected features of a power detector transfer function.

FIG. 7 illustrates selected linearized features of a transfer function 700 of an exemplary power detector, such as the power detector 630. The transfer function 700 is a relationship between the input power level of the power detector 630 (plotted on the horizontal axis x) versus the output voltage or current of the power detector 630 (plotted on the vertical axis y). The output of the power detector 630 is (1) essentially a constant low level (<L1) until about power level P1, (2) essentially a constant high level (>H1) after the power detector saturates at about power level P2, and (3) a gradually increasing portion between P1 and P2. The slope of the gradually increasing portion may be substantially constant (on a logarithmic scale), but this is not a requirement. As follows from the graph of FIG. 7, the output of the power detector 630 can be understood as indicating input power that is too low (output≈L1), input power that is too high (output≈H1), and output power within range (output between L1 and H1). The power detector 630 may be able to react (change its output in response to a change in its input power) on a subframe basis, i.e., in about 1 ms or less. Typically, the power detector is part of a searcher that performs coherent detection of the PSS across multiple subframes, in order to synchronize the UE to the network.

As shown in FIG. 6, the operation of the AGC is closed loop: the power detector measures the power in a first subframe, performs the algorithmic computations of the needed AGC adjustment in a second subframe (which may, but not necessarily is, the immediately following subframe), and is ready to apply the new computed AGC in a third subframe (which may, but not necessarily is, the following subframe). For FDD, the second subframe may immediately follow the first subframe, and the third subframe may immediately follow the second subframe. (In FDD all subframes in the DL frequency are assigned to DL.) For TDD, however, the second subframe may be the DL subframe that immediately follows the first subframe (which is also a DL subframe), and the third subframe is the DL subframe that immediately follows the second subframe (which is also a DL subframe). But there may also be UL subframes between successive DL subframes of the same frame.

Although the power detector 630 may react on a subframe basis, AGC adjustments may take substantially longer because of the accumulator 640; for example, the accumulator 640 may integrate continually or continuously. This allows averaging to take place to track changes in power due to relatively slow shadowing, but without excessive adjustments due to abrupt Raleigh fading.

As noted above, a problem exists in acquiring the proper AGC state on power up or a similar event, before the subframe boundaries (in time) and the configuration (UL/DL subframes within a frame) are known. To improve on the brute-force approach of trying to acquire by going through the different AGC states in an arbitrary order (e.g., sequentially), the UE may be configured to exploit known features of all the configurations of UL/DL subframes in combination with typical operation of the power detector 630. Using an LTE system as an illustrative and not necessarily limiting example, one of the known features is that $0^{th}$ and $5^{th}$ subframes of each frame are DL subframes. This is illustrated in Table 1 below, which lists the seven possible TDD configurations for UL subframes, DL subframes, and Special Subframes (SS).

In examples, the periodicity of the subframes containing the synchronization signal may be other than five.

Figure 8:
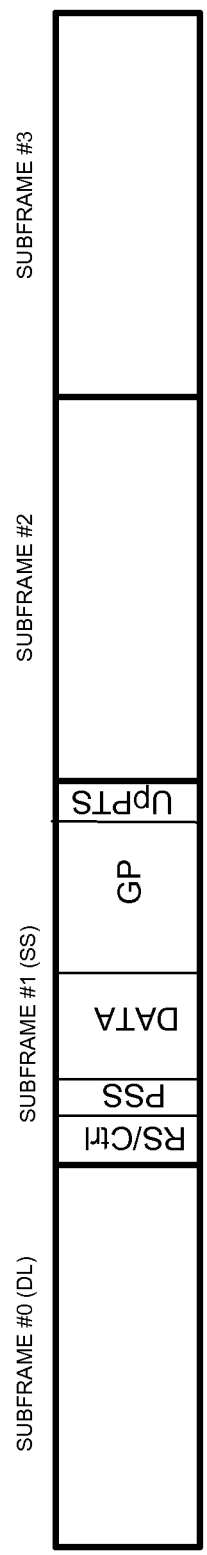
FIG. 8 illustrates selected features of TDD subframes.

The other known feature in this not necessarily limiting example is that the Primary Synchronization Signal or PSS is transmitted early (as the third OFDM symbol) in subframes 1 and 6 of each frame. The duration of the PSS can be a small number of consecutive samples. FIG. 8 illustrates exemplary subframes 0 through 3, including details of an SS subframe with its PSS.

Figure 9:
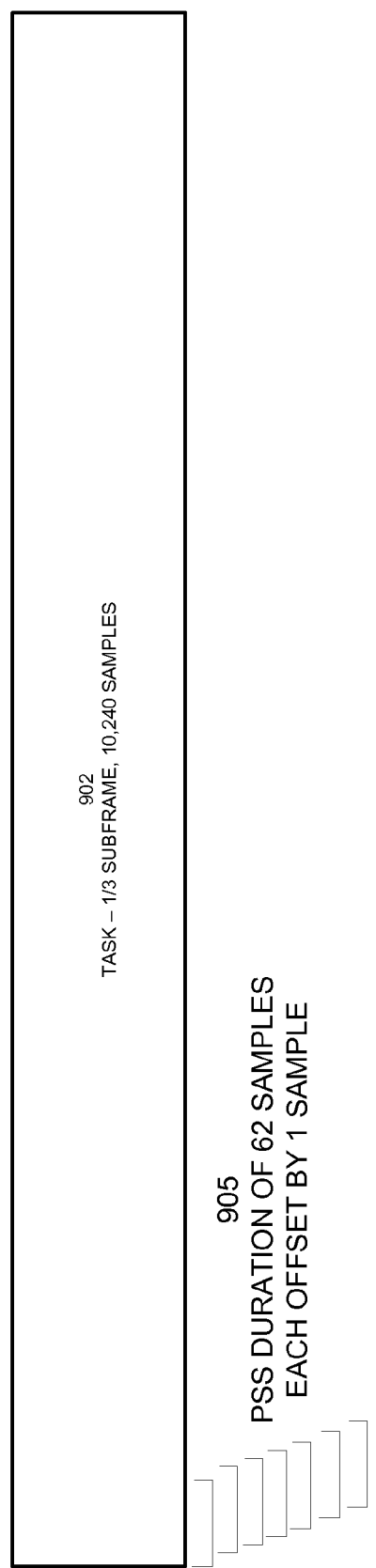
FIG. 9 illustrates selected features of power detector operation in successive offset PSS periods.

For AGC acquisition, the power detector 630 may be configured to operate by dividing each subframe into three tasks. More generally, each subframe may be divided into M tasks, where M is two or a larger integer. In each task, the power detector computes the highest power for each of the possible PSS periods. Thus, the power detector can be configured to determine the power during samples 0-61, 1-62, 2-63, and so on with an offset of one sample. For each task, the power detector outputs the highest energy of all the PSS periods in the task. FIG. 9 shows a task 902 and brackets 905 denoting successive PSS periods. The offset of each PSS period from the immediately preceding PSS period may be one sampling period. The power detector 630 coherently correlates the signal of each of the PSS periods of the task with the known PSS signal, attempting to detect the actual PSS signal transmitted by the Node B. PSS may be detected in response to the correlation yielding an energy result over a predefined limit, or by the energy result peaking above a predefined limit Successful detection of PSS generally requires acquisition of AGC, i.e., a setting of the LNA gain at least close to the proper setting.

The presence of a PSS in the first third of subframes 1 and 6 guarantees that the task immediately preceding the task containing the PSS will fall on a subframe 0 or subframe 5, that is, on a DL subframe. (This may be clear from FIG. 8 and Table 1 above.) During AGC acquisition, the UE is configured to maintain a plurality of N×M AGC loops. Each of the loops may be similar to the exemplary loop shown in FIG. 6, with an addition of a delay element that provides a delay of k tasks. The integer k may be equal to one or two, for example.

Figure 10:
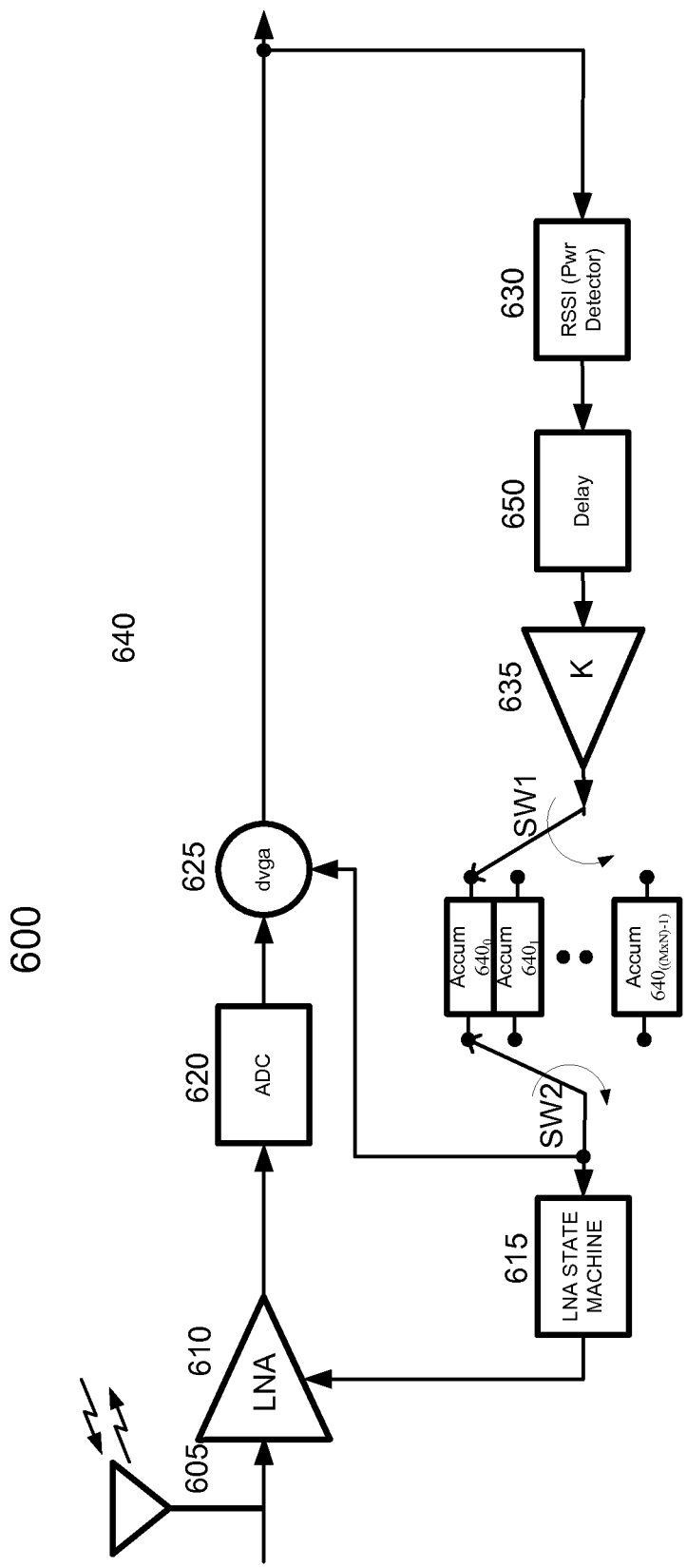
FIG. 10 illustrates selected elements of an AGC loop in acquisition mode.

An arrangement 1000 in accordance with this description is shown in FIG. 10. The loops in the arrangement 1000 share most components, but the accumulator is different for each of the loops. Thus, each of the loops in the arrangement 1000 is similar to the loop shown in FIG. 6, but here a pair of switches SW1 and SW2 are added to the arrangement to enable selection of a different accumulator 640, for each different loop. The switches SW1 and SW2 operate in sequence, so that SW1 connects to the input of an accumulator $640_i$ at the same time when the switch SW1 connects to the output of the same accumulator $640_i$. For each task, the switches SW1/SW2 together select another accumulator. The selection may proceed, for example, in a round robin fashion, with the switches SW1/SW2 returning to each of the accumulators 640 after a

TABLE 1

| Uplink-downlink configuration | Downlink-to-Uplink Switch-point periodicity | Subframe Number | | | | | | | | | |
|---|---|---|---|---|---|---|---|---|---|---|---|
| | | 0 | 1 | 2 | 3 | 4 | 5 | 6 | 7 | 8 | 9 |
| 0 | 5 ms | DL | SS | UL | UL | UL | DL | SS | UL | UL | UL |
| 1 | 5 ms | DL | SS | UL | UL | DL | DL | SS | UL | UL | DL |
| 2 | 5 ms | DL | SS | UL | DL | DL | DL | SS | UL | DL | DL |
| 3 | 10 ms | DL | SS | UL | UL | UL | DL | DL | DL | DL | DL |
| 4 | 10 ms | DL | SS | UL | UL | DL | DL | DL | DL | DL | DL |
| 5 | 10 ms | DL | SS | UL | DL | DL | DL | DL | DL | DL | DL |
| 6 | 5 ms | DL | SS | UL | UL | UL | DL | SS | UL | UL | DL | complete cycle of N×M tasks. This, in effect, makes for N×M loops, a different loop for each task in a given cycle of N×M successive tasks. There are N×M loops because that is the periodicity of the guaranteed DL subframes (e.g., the subframes 0 and 5 that are guaranteed to be DL subframes) expressed in task units of time duration. Each subframe contains multiple tasks, for example three tasks, each task a fixed fraction of the subframe in duration. In each of the loops, the LNA gain is determined by the output of the LNA state machine 615; the output of the LNA state machine is based on the input to the state machine, which input is based on the output of the accumulator 640, corresponding to the given loop. Note that each accumulator 640, operates for one task within each cycle of N×M tasks. The multiple loops share most components; in variants, the different loops use different tables to store the states of the different accumulators $640_i$.

On power up or another event when AGC acquisition is needed, the UE may be configured to begin performing the tasks of fractional (e.g., ⅓) subframe duration, at an arbitrary time relative to the actual (unknown) system timing. But wherever the arbitrary beginning of the tasks is relative to the subframe boundaries, the AGC gain for each task position (within the N×M tasks of a cycle) task that contains only DL transmissions may converge on the correct gain. This is so because DL transmissions recur consistently within the loop, i.e., the accumulator $640_i$ of the loop accumulates the state information based on DL power only (and not UL power) for the loops corresponding to 0 and 5 subframe numbers. Note that the actual LNA state for a particular task position within the cycle of (M×N) tasks is that which is derived from a previous position delayed by k tasks. If k=1, then the LNA state for a particular task position is derived from the power measurements corresponding to the immediately preceding task position. Without loss of generality, we will discuss the case of k=1.

Once the AGC converges (that is, AGC is acquired for DL tasks), the UE uses the acquired AGC to decode the tasks in positions immediately following the task position for which AGC was acquired. From Table 1 above and FIG. 8, it is clear that the PSS follows DL tasks. Therefore, for k=1, the PSS may be successful decoded, because the AGC state is set correctly for the DL task immediately preceding the task with the PSS. Note that the RF signal power generally varies at a rate that is slow compared to the task duration, so that correct AGC setting for a DL task will generally also be correct for the immediately following task containing the PSS. When the PSS is successfully decoded, the UE may gain the knowledge of the timing of the network. At this point, there is no need to maintain all the multiple loops, or to keep the delay element 650. Consequently, the UE can switch to tracking mode based on the subframes 0 and 5, deallocating resources previously used for the multiple loops and removing the delay element 650. After some time, the UE receives a configuration message that identifies the current TDD configuration from among the possible TDD configurations. The UE can then begin operating normally, for example, transmitting and receiving information. The information may include audio, video, and other traffic data. The received data may be demodulated, decoded, and rendered (e.g., displayed, converted into sound) as needed.

It is possible that the initial arbitrary timing is such that the PSS is split between two adjacent tasks, which may prevent detection of the PSS. If this is the case, i.e., the UE converges in the correct AGC but is unable to detect the PSS, the process above may be repeated after shifting the timing by a fraction of a task, for example, by ½ of a task.

The numerology of the above example is used for illustrative purposes. Generally, the periodicity of the subframes carrying the synchronization signal is not necessarily five, and each subframe may be divided into more or fewer than three tasks. Also, the element 650 may be deleted (k=0), in which case the UE determines when AGC has converged for one of the loops, and uses the gain of that loop for other task positions within the cycle of M×N tasks; in this example, For this to work as you intend, the switches SW1 and SW2 may be disabled to cause all the tasks to use the same loop.

Figure 11:
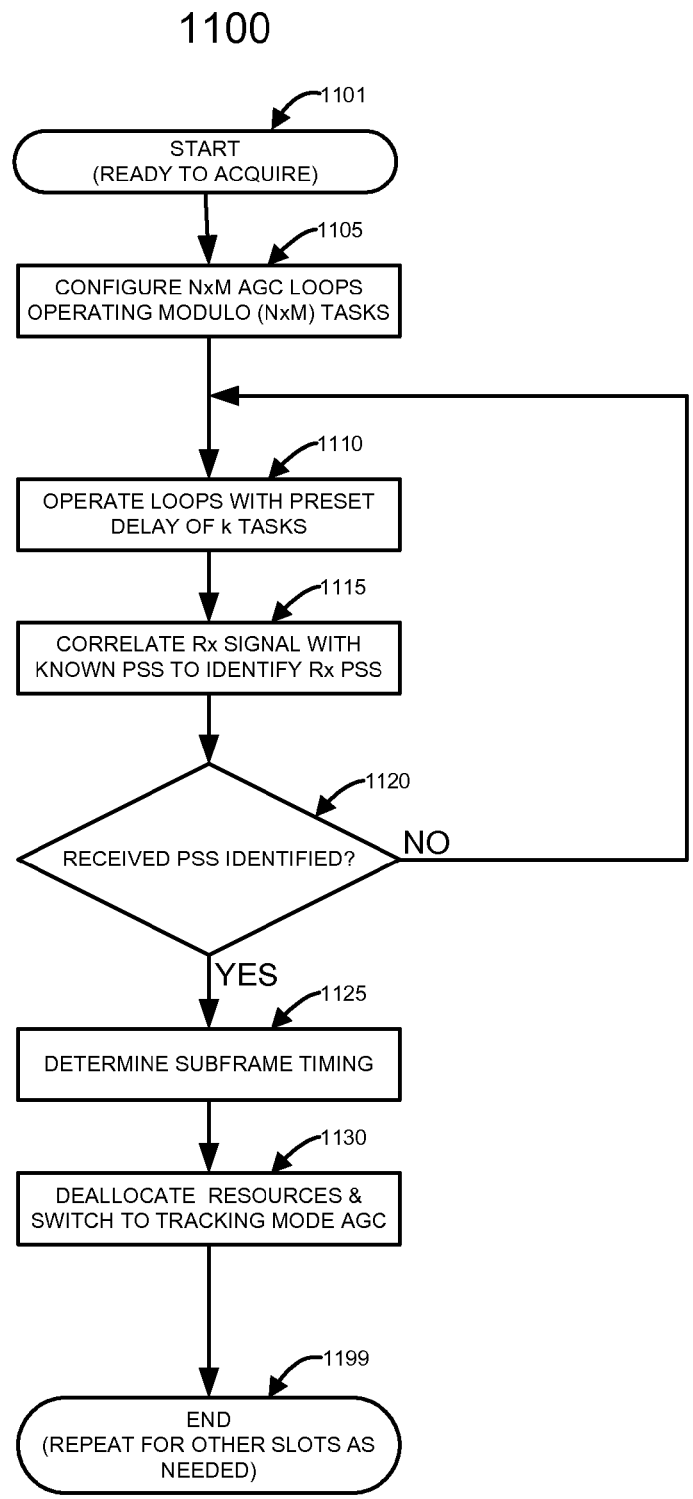
FIG. 11 illustrates selected steps/decisions of a process for acquiring AGC and network timing.

FIG. 11 illustrates selected steps of an exemplary process 1100 performed by a UE in acquiring a network using TDD.

At flow point 1101, the UE has been powered up, entered a service area of a node B, and is ready to acquire the network.

In step 1105, the UE configures (N×M) AGC loops, with each loop considering only tasks modulo (N×M), M being the number of tasks per subframe and N being the guaranteed DL subframe periodicity within a frame. By this we mean that each loop considers or operates on every Pth task (P=N×M), ignoring the other tasks, and that each AGC loop operates on a different set of tasks (i.e., different task position within the N×M tasks), so that every task is considered by one of the AGC loops. In the LTE embodiment discussed above, a different AGC loop may operate on every fifteenth task, with three tasks per subframe, and every 0 subframe and 5 subframe within a frame guaranteed to be DL subframes. Thus, one AGC loop will consider tasks 0, 15, 30, 45, . . . ; another AGC loop will consider tasks 1, 16, 31, 46, . . . ; and so on until a fifteenth AGC loop will consider tasks 14, 29, 44, . . . .

The AGC loops may be identical, analogous, or similar to the loops of FIG. 10.

In step 1110, the loops are operated. Every loop considers a different set of tasks. In adjusting the current LNA gain, each loop sets its LNA state machine output in accordance with the indication of the power detector k tasks earlier (k being zero or a positive integer). In other words, the LNA state during task K is determined by the output of the power detector generated as a result of task (K-k).

In step 1115, the UE is coherently correlating the received signal in each of the task positions with a known synchronization signal sequence, attempting to identify the synchronization signal in the received signal. For the LTE embodiment, the synchronization signal may be the PSS.

In decision block 1120, the UE determines whether the synchronization signal has been detected in the received signal. If not, process flow returns to the step 1110. If the synchronization signal has been detected, the process flow proceeds to step 1125, where the UE determines the timing of the subframes based on the detected synchronization signal.

In step 1130, the UE deallocates resources from the (N×M) loops configured in the step 1105 and simultaneously switches AGC to tracking mode based on DL subframes, which may be subframes 0 and 5 in the LTE embodiment.

Process flow then terminates in flow point 1199. It is be noted that the process 1100 would typically be repeated when AGC needs to be re-acquired.

Although steps and decision blocks of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them and the accompanying Figures show them, except where explicitly so indicated, otherwise made clear from the context, or inherently required. It is be noted, however, that in selected examples the steps and decisions are performed in the particular progressions described above and/or shown in the accompanying Figures. Furthermore, not every illustrated step and decision may be required in every system, while some steps and decisions that have not been specifically illustrated may be desirable or necessary in some embodiments.

Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments and variants disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments and variants disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media include both computer storage media and communication media including any medium that facilitates transfer of a computer program from one place to another. A storage media may be any available media that can be accessed by a computer. By way of example, and not limitation, such computer-readable media can include RAM, ROM, EEPROM, CD-ROM or other optical disk storage, magnetic disk storage or other magnetic storage devices, flash memory, or any other non-transitory medium that can be used to carry or store desired program code in the form of instructions or data structures and that can be accessed by a computer. Also, any connection is properly termed a computer-readable medium (but not storage medium). For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. The terms disk and disc, as used herein, include compact disc (CD), laser disc, optical disc, digital versatile disc (DVD), floppy disk and blu-ray disc, where disks usually reproduce data magnetically, while discs reproduce data optically, for example, with lasers and LEDs. Combinations of the above may also be included within the scope of computer-readable media.

The previous description of the disclosed embodiments, examples, and variants is provided to enable any person skilled in the art to make or use the present invention. Various modifications to these embodiments, examples, and variants will be readily apparent to those skilled in the art, and the generic principles defined herein may be applied to other embodiments, examples, and variants, without departing from the spirit or scope of the invention. Thus, the present invention is not intended to be limited to the embodiments and variants shown herein, but is to be accorded the widest scope consistent with the principles and novel features disclosed herein.

Therefore, the present invention is not to be limited except in accordance with the claims.

What is claimed is:

1. A wireless communication method comprising steps of:
receiving a signal comprising frames, each of the frames comprising subframes;
configuring a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks;
operating said each AGC loop;
correlating the received signal with a known synchronization signal to detect a pattern of the known synchronization signal within the received signal; and
determining, in response to detection of the pattern of the known synchronization signal within the received signal, subframe timing of the received signal.

2. The wireless communication method of claim 1, further comprising:
switching to tracking mode AGC operation in response to a determination of the subframe timing.

3. The wireless communication method of claim 1, wherein in each of the frames the pattern of the known synchronization signal occurs within a subframe immediately following a subframe that is guaranteed to be a downlink (DL) subframe, and the pattern of the known synchronization signal occurs within the predetermined task duration of beginning of the subframe immediately following the subframe that is guaranteed to be a downlink (DL) subframe.

4. The wireless communication method of claim 1, wherein the step of configuring is performed so that at least two AGC loops of the plurality of AGC loops share all components except accumulators.

5. The wireless communication method of claim 3, wherein the pattern of the known synchronization signal is a Primary Synchronization Signal (PSS) pattern, and N equals five.

6. The wireless communication method of claim 3, wherein the pattern of the known synchronization signal is a Primary Synchronization Signal (PSS) pattern, N equals five, and M equals three.

7. The wireless communication method of claim 3, wherein the pattern of the known synchronization signal is a Primary Synchronization Signal (PSS) pattern, N equals five, M equals three, and the task delay is equal to a duration of one task.

8. The wireless communication method of claim 3, further comprising deallocating resources of the plurality of AGC loops in response to the detection of the pattern of the known synchronization signal within the received signal.

9. The wireless communication method of claim 3, further comprising switching to AGC tracking mode in response to the detection of the pattern of the known synchronization signal within the received signal.

10. The wireless communication method of claim 3, wherein the pattern of the known synchronization signal is a Primary Synchronization Signal (PSS) pattern, N equals five, M equals three, and the task delay is equal to a duration of two tasks.

11. The wireless communication method of claim 10, wherein the step of correlating comprises coherently correlating each PSS period with a known PSS signal pattern.

12. The wireless communication method of claim 11, wherein successive PSS periods are offset by one chip.

13. The wireless communication method of claim 11, wherein the synchronization signal within the received signal is detected in response to the step of correlating yielding an energy result over a first predefined limit, or by the energy result peaking above a second predefined limit.

14. A computer program product, comprising:
non-transitory computer-readable storage comprising:
code for receiving at a user equipment (UE) a received signal comprising frames, each of the frames comprising subframes;
code for configuring at the UE a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks;
code for operating said each AGC loop;
code for correlating the received signal with a known synchronization signal to detect a pattern of the known synchronization signal within the received signal;
code for determining, in response to detection of the pattern of the known synchronization signal within the received signal, subframe timing of the received signal; and
code for switching the UE to tracking mode AGC operation in response to determination of the subframe timing.

15. The computer program product of claim 14, wherein in each of the frames the pattern of the known synchronization signal occurs within a subframe immediately following a subframe that is guaranteed to be a downlink (DL) subframe.

16. The computer program product of claim 15, wherein the pattern of the known synchronization signal occurs within the predetermined task duration of beginning of the subframe immediately following the subframe that is guaranteed to be a downlink (DL) subframe.

17. The computer program product of claim 16, wherein the pattern of the known synchronization signal is a Primary Synchronization Signal (PSS) pattern, N equals five, and M equals three.

18. The computer program product of claim 16, wherein the non-transitory computer-readable storage further comprises code for deallocating resources of the AGC loops in response to the detection of the pattern of the known synchronization signal within the received signal.

19. Wireless user equipment (UE) comprising:
least one processor, wherein the at least one processor is configured to:
receive at the user equipment a received signal comprising frames, each of the frames comprising subframes;
configure a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks;
operate said each AGC loop;
correlate the received signal with a known synchronization signal to detect a pattern of the known synchronization signal within the received signal; and
determine, in response to detection of the pattern of the known synchronization signal within the received signal, subframe timing of the received signal; and
memory operably connected to said at least one processor.

20. The wireless user equipment of claim 19, wherein the processor is further configured to switch to tracking mode AGC operation in response to a determination of the subframe timing.

21. The wireless user equipment of claim 19, wherein in each of the frames the pattern of the known synchronization signal occurs within a subframe immediately following a subframe that is guaranteed to be a downlink (DL) subframe, and the pattern of the known synchronization signal occurs within the predetermined task duration of beginning of the subframe immediately following the subframe that is guaranteed to be a downlink (DL) subframe.

22. The wireless user equipment of claim 19, wherein at least two AGC loops of the plurality of AGC loops are configured to share all components except accumulators.

23. The wireless user equipment of claim 21, wherein the pattern of the known synchronization signal is a Primary Synchronization Signal (PSS) pattern, and N equals five.

24. The wireless user equipment of claim 21, wherein the pattern of the known synchronization signal is a Primary Synchronization Signal (PSS) pattern, N equals five, and M equals three.

25. The wireless user equipment of claim 21, wherein the pattern of the known synchronization signal is a Primary Synchronization Signal (PSS) pattern, N equals five, M equals three, and the predetermined task delay is equal to a duration of one task.

26. The wireless user equipment of claim 21, wherein the at least one processor is further configured to deallocate resources of the plurality of AGC loops in response to the detection of the pattern of the known synchronization signal within the received signal.

27. The wireless user equipment of claim 21, wherein the at least one processor is further configured to:
switch to AGC tracking mode in response to the detection of the pattern of the known synchronization signal within the received signal.

28. The wireless user equipment of claim 21, wherein the pattern of the known synchronization signal is a Primary Synchronization Signal (PSS) pattern, N equals five, M equals three, and the task delay is equal to a duration of one task.

29. The wireless user equipment of claim 28, wherein the at least one processor is further configured to coherently correlate each PSS period with a known PSS signal pattern.

30. The wireless user equipment of claim 29, wherein successive PSS periods are offset by one chip.

31. The wireless user equipment of claim 29, wherein the synchronization signal within the received signal is detected in response to the step of correlating yielding an energy result over a predefined limit, or by the energy result peaking above the predefined limit.

32. An apparatus for communicating wirelessly, comprising:
means for receiving a signal comprising frames, each of the frames comprising subframes;
means for configuring a plurality of M×N automatic gain control (AGC) loops, each AGC loop of the plurality of AGC loops being configured for modulo M×N tasks operation, each task having a predetermined task duration, M of the tasks per subframe, M being an integer greater than one, N being periodicity of guaranteed downlink (DL) subframes within the frames, wherein said each AGC loop includes a predetermined task delay in front of an input of an accumulator of said each AGC loop, the predetermined task delay being equal to an integer number of tasks;
means for operating said each AGC loop;
means for correlating the received signal with a known synchronization signal to detect a pattern of the known synchronization signal within the received signal; and
means for determining, in response to detection of the pattern of the known synchronization signal within the received signal, subframe timing of the received signal.

33. The apparatus of claim 32, further comprising:
means for switching to tracking mode AGC operation in response to a determination of the subframe timing.

34. The apparatus of claim 32, wherein in each of the frames the pattern of the known synchronization signal occurs within a subframe immediately following a subframe that is guaranteed to be a downlink (DL) subframe, and the pattern of the known synchronization signal occurs within the predetermined task duration of beginning of the subframe immediately following the subframe that is guaranteed to be a downlink (DL) subframe.

35. The apparatus of claim 32, wherein the means for configuring is performed so that at least two AGC loops of the plurality of AGC loops share all components except accumulators.

36. The apparatus of claim 34, wherein the pattern of the known synchronization signal is a Primary Synchronization Signal (PSS) pattern, and N equals five.

37. The apparatus of claim 34, wherein the pattern of the known synchronization signal is a Primary Synchronization Signal (PSS) pattern, N equals five, and M equals three.

38. The apparatus of claim 34, wherein the pattern of the known synchronization signal is a Primary Synchronization Signal (PSS) pattern, N equals five, M equals three, and the task delay is equal to a duration of one task.

39. The apparatus of claim 34, further comprising means for deallocating resources of the plurality of AGC loops in response to the detection of the pattern of the known synchronization signal within the received signal.

40. The apparatus of claim 34, further comprising means for switching to AGC tracking mode in response to the detection of the pattern of the known synchronization signal within the received signal.

41. The apparatus of claim 34, wherein the pattern of the known synchronization signal is a Primary Synchronization Signal (PSS) pattern, N equals five, M equals three, and the task delay is equal to a duration of two tasks.

42. The apparatus of claim 41, wherein the means for correlating comprises coherently correlating each PSS period with a known PSS signal pattern.

43. The apparatus of claim 42, wherein successive PSS periods are offset by one chip.

44. The apparatus of claim 42, wherein the synchronization signal within the received signal is detected in response to the means for correlating yielding an energy result over a first predefined limit, or by the energy result peaking above a second predefined limit.

* * * * *